United States Patent [19]

Debesis

[11] 3,889,286

[45] June 10, 1975

[54] TRANSPARENT MULTIPLE CONTACT FOR SEMICONDUCTOR LIGHT CONVERSION ELEMENTS

[75] Inventor: John R. Debesis, Richmond Heights, Ohio

[73] Assignee: General Electric Company, Schenectady, N.Y.

[22] Filed: Dec. 26, 1973

[21] Appl. No.: 427,934

[52] U.S. Cl. ........................ 357/67; 357/68; 357/81; 357/17

[51] Int. Cl. ............................ H01l 3/00; H01l 5/00

[58] Field of Search .......... 317/234, 5, 5.2, 5.3, 5.4, 317/235, 27, 31

[56] References Cited

UNITED STATES PATENTS

| | | | |
|---|---|---|---|
| 3,255,393 | 6/1966 | Hutchins et al. | 317/235 UA |
| 3,330,983 | 7/1967 | Cusano et al. | 317/235 N |
| 3,386,867 | 6/1968 | Staples | 317/234 L |
| 3,448,349 | 6/1969 | Sumner | 317/235 UA |
| 3,539,883 | 11/1970 | Harrison | 317/235 N |
| 3,679,949 | 7/1972 | Uekusa et al. | 317/235 UA |
| 3,684,930 | 8/1972 | Collins et al. | 317/234 L |
| 3,728,785 | 4/1973 | Schmidt | 317/234 L |

*Primary Examiner*—Andrew J. James
*Attorney, Agent, or Firm*—Norman C. Fulmer; Lawrence R. Kempton; Frank L. Neuhauser

[57] ABSTRACT

A plurality of individual contact areas are distributed over a surface of a semiconductor light conversion element such as a light-emitting diode. A layer of transparent electrically conductive material such as tin oxide is deposited over the surface and in contact with the contact areas, and a conductor member is connected to the transparent layer.

7 Claims, 2 Drawing Figures

PATENTED JUN 10 1975

3,889,286

TRANSPARENT MULTIPLE CONTACT FOR SEMICONDUCTOR LIGHT CONVERSION ELEMENTS

CROSS-REFERENCES TO RELATED APPLICATIONS

Serial No. 427,803, John R. Debesis, "Method of Making Contacts to Semiconductor Light Conversion Elements," filed concurrently herewith and assigned the same as this invention.

Serial No. 427,936, John R. Debesis, "Reflective Coated Multiple Contact for Semiconductor Light Conversion Elements," filed concurrently herewith and assigned the same as this invention.

BACKGROUND OF THE INVENTION

The invention is in the field of solid state light conversion devices employing light-emitting diodes or light-sensitive diodes and functioning in the infrared or visible light spectrum. In solid state lamps, the light-emitting diode is made from a flat "chip" of material, such as gallium arsenide, gallium phosphide, gallium arsenide phosphide, or silicon carbide, suitably doped with dopant material so as to form a p-n junction which emits light (visible or infrared) when current is passed therethrough. The p-n junction is between and parallel to the "top" and "bottom" surfaces of the diode, it being assumed for convenience that the light to be utilized is that which emerges through the top surface. Of the light emitted by the p-n junction, only a small amount exits through the top surface of the diode, due to the effect of the "critical angle" caused by the high index of refraction of the diode material whereby only the light rays approaching the top surface perpendicularly and approximately perpendicularly can pass through the surface and become usefully emitted light, whereas the remaining majority of light rays are internally reflected at the top surface.

The amount of light emitted through the top surface of the diode can be increased by encapsulating the top surface of the diode with a material having a refractive index greater than unity, i.e. greater than that of air, thereby increasing the critical angle whereby a greater amount of light exits through the top surface, as described in U.S. Pat. No. 3,676,668 to Collins, Kerber, and Neville.

SUMMARY OF THE INVENTION

Objects of the invention are to provide improved transparent contacts to semiconductor light conversion elements, which can be manufactured easily and at low cost, and to increase the efficiency and light output of such elements.

The invention comprises, briefly and in a preferred embodiment, a plurality of individual contact areas distributed over and attached to a surface of a semiconductor light conversion element, a layer of transparent material such as tin oxide deposited over said surface and in contact with the contact areas, and means electrically connecting said transparent layer to a conductor member. The aforesaid contact areas can but need not be raised from the surface of the element.

DESCRIPTION OF THE PREFERRED EMBODIMENTS

Figure 1:
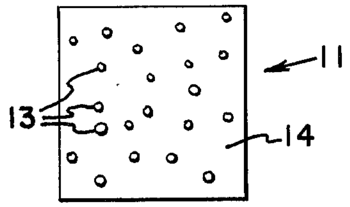
FIG. 1 is a top view of a p-n junction semiconductor light conversion element having distributed individual contact areas on a surface thereof.

A p-n junction semiconductor light conversion element 11, such as a light-emitting diode or a light-sensitive diode, has a p-n junction 12 therein substantially parallel to the top and bottom surfaces thereof. The element 11 may be made from suitably doped gallium arsenide, gallium phosphide, or other suitable materials. A plurality of individual contact areas 13 are distributed over a surface 14 of the element 11. The contact areas 13 may be formed by applying a layer of metal over the semiconductor surface 14 and heating to a temperature such that the metal layer dissociates into the distributed areas 13 in the form of individual lumps of metal sintered or alloyed to the semiconductor surface 14. For a n-doped gallium phosphide semiconductor, for example, a suitable metal for the aforesaid layer is a gold-12 weight percent germanium eutectic, which is temporarily heated to about 550°C to 600°C for a time of about 2 to 5 minutes, in a reducing atmosphere, thereby causing the distributed raised areas 13 to form and become sintered or alloyed to the surface 14. Further details of this method are disclosed in the above-referenced patent application Ser. No. 427,803. Preferably, only a small amount (such as 5%) of the total area of the surface 14 is occupied by the metal contact areas 13, the remaining major portion (such as 95%) of the surface area being free of metal. Another method of forming the contact areas 13 is to place over the semiconductor surface 14 a mask having a plurality of openings through which metal is evaporated, sputtered, or otherwise deposited on the surface 14 to form the contact areas 13; the mask is removed and the assembly is heated to sinter or alloy the metal areas onto the surface 14. The relative size of the contact areas 13 is exaggerated in the drawing, and may have maximum heights of about 0.01 mm, for example. The contact areas need not be raised, and may be very thin or coplanar with the surface 14 of the light conversion element.

Figure 2:
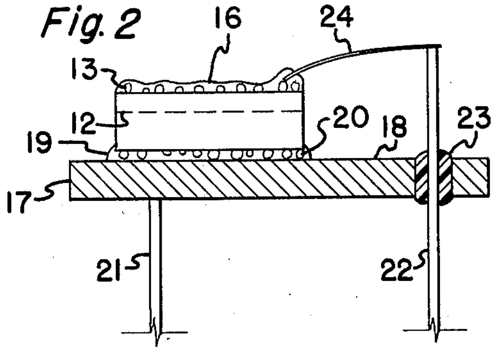
FIG. 2 is a side view of the light conversion element of FIG. 1 with the surface shown in FIG. 1 facing upwardly and covered with a layer of transparent electrically conductive material, its other surface being bonded to a header.

A layer 16 of transparent electrically conductive material such as tin oxide is deposited over the surface 14, as shown in FIG. 2. The material for layer 16 can be evaporated or sputtered, by well-known methods, onto the surface 14. The layer 16 must not be fused nor sintered onto the surface 14 of the element 11, for to do so would cause this interface to absorb, rather than transmit, light in the element 11. Transparent or semi-transparent conductive resin can be employed for the layer 16.

The semiconductor element 11 is positioned, with surface 14 facing upwardly, on a header 17 as shown in FIG. 2, and the opposite surface of element 11 is bonded to the surface 18 of the header, such as by conventional alloying or by means of electrically conductive cement 19 which bonds contact areas 20 (which may be made the same way as the contact areas 13) to the surface 18 of the header. The construction is completed by providing a lead-in conductor 21 attached to the header 17, and a second lead-in conductor 22 extending through an opening in the header 17 and held in place and electrically insulated from the header by a glass or ceramic bead 23. A fine wire 24 is attached to the upper end of the lead-in wire 22, and this wire is connected to the transparent conductive layer 16 such as by pressure contact, or embedding a portion of it in the layer 16 (as shown), or cementing it to the layer 16. The structure may be encapsulated as described in the above-referenced patent, or may be provided with a cylindrical cap and lens as described in U.S. Pat. No. 3,458,779, issued July 29, 1969 to Drs. Blank and Potter. In operation, the transparent layer 16 at the top surface 14 of the element 11 provides electrical connection from the conductor wire 24 to all of the contact areas 13, and at the same time, being transparent, permits light produced at the junction 12 to be emitted upwardly from the assembly. Also, if the material of the layer 16 has a refractive index greater than unity (i.e. greater than that of air), it increases the critical angle of the surface 14 thereby permitting more light to be usefully emitted. Tin oxide is a suitable transparent conductive material and has a refractive index greater than unity.

Although the deposited layer 16 makes relatively poor electrical contact to the semiconductor element 11, it makes good electrical contact to the contact areas 13, which in turn make good electrical contact to the semiconductor element 11. The distribution of the contact areas 13 provides substantially uniform current density over the contact surface 14, which is desirable. Although the distributed contacts 13 are shown as being raised, this is not necessary; the contacts 13 can be flush with the surface 14. Although the transparent layer 16 is shown as covering the distributed contacts 13 as well as the semiconductor surface 14, this is not necessary as long as it makes electrical contact with these areas. The term "transparent" as applied herein to the layer 16 does not necessarily connote a high degree of transparency, but also includes materials having any degree of transparency that can be used for the intended purpose and for the color of light utilized. The principles are also useful for light-sensitive semiconductor elements 11.

While preferred embodiments and modifications of the invention have been shown and described, other embodiments and modifications will become apparent to persons skilled in the art and will be within the scope of the invention as defined in the following claims.

What I claim as new and desire to secure by Letters Patent of the United States is:

1. A transparent contact construction for a solid state light conversion element, comprising a plurality of individual electrical contact areas distributed over and attached to a surface of said light conversion element, a layer of transparent electrically conductive material disposed over said surface and in contact with said contact areas, and a conductor member electrically connected to said layer of transparent electrically conductive material.

2. A construction as claimed in claim 1 in which said transparent material comprises tin oxide.

3. A construction as claimed in claim 2 in which said transparent layer covers over and is in contact with said contact areas.

4. A construction as claimed in claim 1 in which said contact areas are raised from said surface of the light conversion element.

5. A construction as claimed in claim 4 in which said transparent layer covers over and is in contact with said contact areas.

6. A construction as claimed in claim 1 in which said conductor member is partially embedded in said transparent layer.

7. A construction as claimed in claim 1 in which a second plurality of individual contact areas are distributed over and attached to the opposite surface of said element, and means making electrical contact to said second plurality of contact areas.

* * * * *